(12) United States Patent
Keeler et al.

(10) Patent No.: US 8,583,986 B2
(45) Date of Patent: Nov. 12, 2013

(54) SOLID-STATE MEMORY WITH ERROR CORRECTION CODING

(75) Inventors: Stanton MacDonough Keeler, Longmont, CO (US); John Edward Moon, Superior, CO (US)

(73) Assignee: Seagate Technology LLC, Cupertino, CA (US)

( * ) Notice: Subject to any disclaimer, the term of this patent is extended or adjusted under 35 U.S.C. 154(b) by 977 days.

(21) Appl. No.: 12/337,133

(22) Filed: Dec. 17, 2008

(65) Prior Publication Data

US 2010/0153821 A1    Jun. 17, 2010

(51) Int. Cl.
*G11C 29/00* (2006.01)

(52) U.S. Cl.
USPC ........................................................ 714/763

(58) Field of Classification Search
USPC ........................................................ 714/763
See application file for complete search history.

(56) References Cited

U.S. PATENT DOCUMENTS

| | | | |
|---|---|---|---|
| 4,811,294 A | 3/1989 | Kobayashi et al. | 365/189 |
| 5,428,630 A | 6/1995 | Weng et al. | 371/40.1 |
| 5,475,693 A | 12/1995 | Christopherson et al. | 371/10.2 |
| 5,668,976 A | 9/1997 | Zook | 395/500 |
| 5,754,566 A | 5/1998 | Christopherson et al. | 371/40.18 |
| 5,754,567 A | 5/1998 | Norman | 371/40.18 |
| 6,601,211 B1 | 7/2003 | Norman | 714/773 |
| 7,315,475 B2 * | 1/2008 | Honda | 365/185.2 |
| 7,475,279 B2 * | 1/2009 | Takahashi et al. | 714/5.11 |
| 8,112,692 B2 * | 2/2012 | Lee et al. | 714/763 |
| 2009/0024905 A1 * | 1/2009 | Shalvi et al. | 714/773 |
| 2010/0153821 A1 * | 6/2010 | Keeler et al. | 714/773 |
| 2010/0313065 A1 * | 12/2010 | Feeley et al. | 714/6 |

OTHER PUBLICATIONS

"HAMCOP Microprocessor Companion Chip: NAND Flash Controller," Samsung Electronics, HAMCOP Manual, Chapter 6.
Samsung Electronics Powerpoint, "NAND Flash ECC Algorithm (Error Checking & Correction)", Samsung Product Planning & Application Engineering Team, Jun. 2004.
F. Sun, K. Rose, and T. Zhang, "On the Use of Strong BCH Codes for Improving Multilevel NAND Flash Memory Storage Capacity," IEEE Workshop on Signal Processing Systems (SiPS): Design and Implementation, Oct. 2006.
"TN-29-05: ECC Module for Xilinx Spartan-3: Overview", Technical Note, Micron Technology, Inc., 2005.

* cited by examiner

*Primary Examiner* — Amine Riad
(74) *Attorney, Agent, or Firm* — Cesari & Reed, LLP; Kirk A. Cesari

(57) ABSTRACT

In a particular embodiment, a storage device is disclosed that includes a solid-state storage media. The storage device further includes a read/write circuit including an error correction coding (ECC) encoder/decoder adapted to write data and associated ECC information to the solid-state storage media without performing a read-verify operation.

20 Claims, 4 Drawing Sheets

SOLID-STATE MEMORY WITH ERROR CORRECTION CODING

FIELD

The present invention relates generally to solid-state memory devices with error correction coding (ECC), and more particularly but not by limitation to solid-state memory devices that use a strong ECC to reduce a number of write operations.

DETAILED DESCRIPTION OF ILLUSTRATIVE EMBODIMENTS

Figure 1:
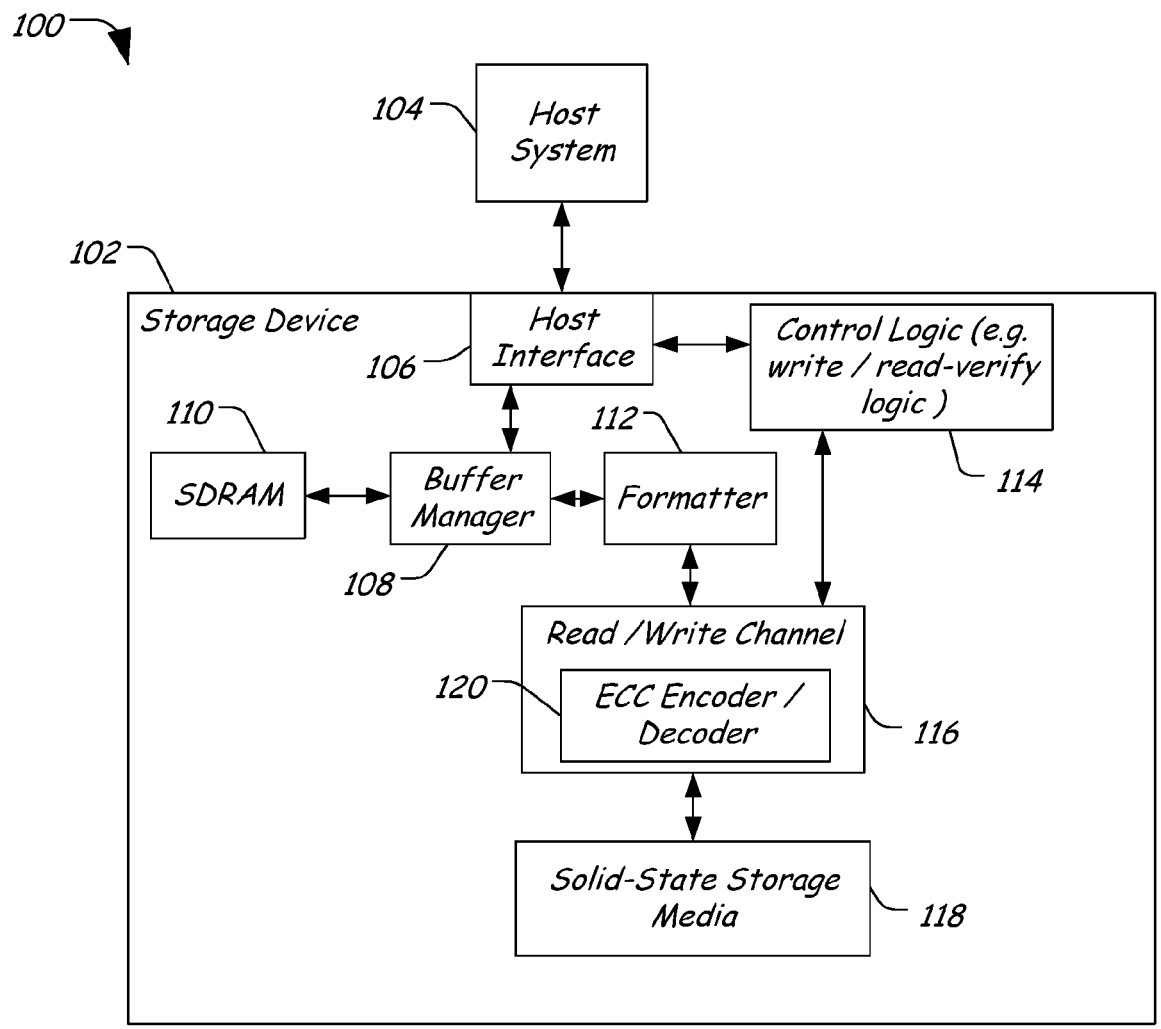
FIG. 1 is a block diagram of a particular illustrative embodiment of a system including a storage device having a solid-state storage media and including error correction coding.

Solid-state memory devices, such as flash memory, can have a write throughput that is much greater than its read throughput. In a particular example, the write throughput can be as much as eight times slower than the read throughput. In a particular example, to program a block of memory of a flash memory device, the flash memory device performs a number of write/read-verify operations. In this particular example, a write operation is performed in order to store data in a memory array of the solid-state memory device. A read-verify operation is then performed to verify the data. If a data error is detected, the solid-state memory device re-writes the data and then performs another read-verify operation to determine if the re-write operation was successful. In a particular example, the write/read-verify process may be repeated multiple times until no errors are detected in the read-verify process. Unfortunately, a storage capacity of a solid-state memory device can degrade over time with each write operation.

In a particular embodiment, a powerful error correction code (ECC) encoder/decoder is used in conjunction with the solid-state memory device to correct a large number of errors in the stored data. The powerful ECC encoder/decoder can use a parameterized class of ECC codes, which are highly flexible, allowing control over block length and acceptable error thresholds, meaning that a custom code can be designed to a given specification (subject to mathematical constraints). In a particular example, the powerful ECC encoder/decoder can use Bose-Chaudhuri-Hocquenghem (BCH) coding to encode and decode data stored at the solid-state data storage media. The BCH code is a multilevel, cyclic, error-correcting, variable-length digital code used to correct multiple random error patterns. BCH codes may also be used with multi-level phase-shift keying schemes. ECC information calculated using such BCH codes can be decoded via syndrome decoding, which allows simple electronic hardware, such as flip-flop circuits and logic gates to decode and error correct received data. It should be understood that BCH coding is one possible ECC coding that can be applied. Other ECC codes that can correct multiple errors in a retrieved page of data can also be used, depending on the implementation. Further, in a particular embodiment, the particular ECC code can be selected to provide a desired level of error correction.

Using such an ECC encoder/decoder, the number of write/read-verify iterations can be reduced. In a particular example, the read/write circuit can rely on the ECC information to store data to the data storage media and to perform read-verify operations only until a number of errors in a stored block (or page) of data can be corrected using the ECC information. If the ECC encoder/decoder design is powerful enough, the read-verify operation can be eliminated completely, significantly improving the write throughput of the device.

In a particular embodiment, a storage device is disclosed that includes a solid-state storage media. The storage device further includes a read/write circuit including an error correction coding (ECC) encoder/decoder adapted to write data and associated ECC information to the solid-state storage media without performing a read-verify operation. In another particular embodiment, the ECC encoder/decoder is used in conjunction with the read/write circuit to program the solid-state storage media in a single programming cycle. In a particular example, the read/write circuit can store data to the solid-state data storage media without performing a read-verify operation.

FIG. 1 is a block diagram of a particular illustrative embodiment of a system 100 including a storage device 102 having a solid-state storage media 118. The solid-state memory 102 is adapted to communicate with a host system 104 to receive data and data storage commands. As used herein, the term "solid-state storage media" or "solid-state memory" refers to data storage medium that utilizes semiconductor properties to represent data values and that has no moving parts to record or retrieve the data. In a particular embodiment, the solid-state memory 102 can be a single layer or multi-layer flash memory, a magnetic random access memory (MRAM), another non-volatile solid-state memory, or any combination thereof.

The storage device 102 includes a host interface 106 that is coupled to the host system 104 and that is responsive to the host system 104 to receive and communicate data. The storage device 102 further includes a buffer manager 108 that is responsive to a synchronous dynamic random access memory (SDRAM) 110 and that is coupled to the host interface 106 to buffer received data from the host system 104. The storage device 102 also includes a formatter 112 that is adapted to format received data appropriately for a destination storage media, such as a solid-state storage media 118 and/or to format the data for transmission to the host system 104 via the host interface 106. The storage device 102 further includes a read/write channel 116 including an error correction coding (ECC) encoder/decoder 120 that is adapted to calculate ECC information for data to be written to the solid-state storage media 118. In a particular embodiment, the ECC encoder/decoder 120 is adapted to correct three or more data errors in a given data block using the ECC information. The read/write channel 116 further includes read/write circuitry (not shown) to write the data and the associated ECC information to the solid-state storage media 118. The storage device 102 further includes control logic 114 coupled to the host interface 106 and to the read/write channel 116. The control logic 114 is adapted to control write and read-verify operations.

In a particular example, the storage device 102 is adapted to receive data and data storage commands from the host system 104 via the interface 106. The buffer manager 108 provides the data to the formatter 112, which formats the data appropriately for the solid-state storage media 118. The formatter 112 provides the data to the read/write channel 116, which includes the ECC encoder/decoder 120 to calculate associated ECC information and which writes the formatted data and the associated ECC information to the solid-state storage media 118. In a particular embodiment, the control logic 114 is adapted to discontinue write/read-verify operations when the verify operation reveals three or more data errors that can be corrected via the ECC encoder/decoder 120, reducing a number of programming operations from three programming tries to one or two programming attempts. In another particular embodiment, the ECC encoder/decoder 120 is sufficiently powerful to eliminate the read-verify operation, allowing the storage device 102 to record received data to the solid-state storage media 118 in a single programming cycle, and without performing a read-verify operation. In a particular example, the ECC encoder/decoder 120 is sufficiently powerful to correct any data errors, enhancing reliability and improving the programming throughput by reducing the number of programming cycles needed to ensure data reliability.

In a particular embodiment, the ECC encoder/decoder 120 is configured to utilize powerful ECC coding, such as a parameterized class of ECC codes, which can be configured to define a block length and acceptable error thresholds. In a particular example, the ECC encoder/decoder 120 can use Bose-Chaudhuri-Hocquenghem (BCH) coding to encode and decode data stored at the solid-state data storage media 118 and to correct multiple errors within a page (or block) of data read from the solid-state storage media 118. In a particular example, the ECC encoder/decoder 120 can include a first parameter to define a block (page) length and a second parameter to configure an acceptable error threshold.

Figure 2:
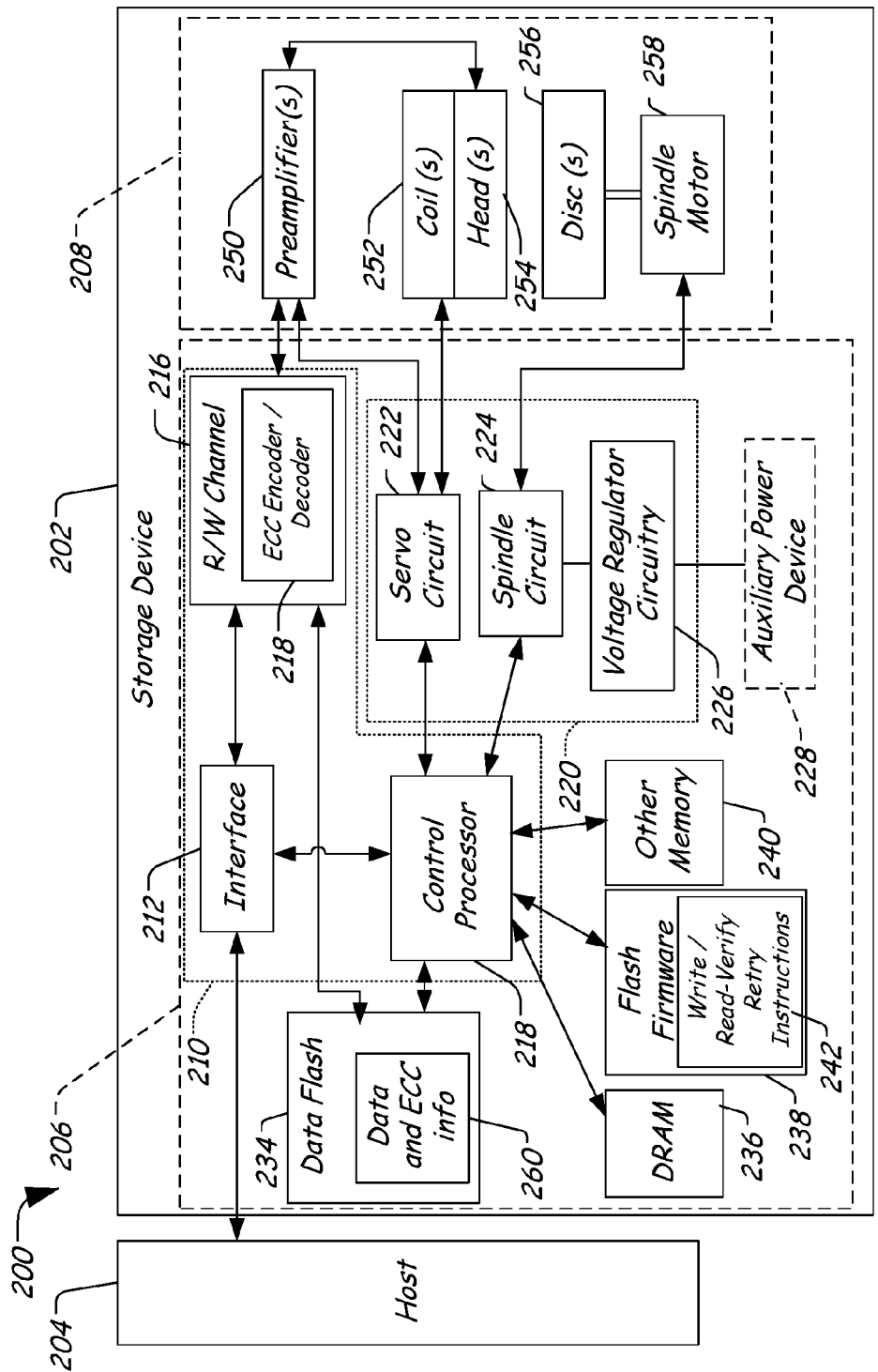
FIG. 2 is a block diagram of a second particular illustrative embodiment of a system including a storage device having a solid-state storage media and including error correction coding.

FIG. 2 is a block diagram of a second particular illustrative embodiment of a system 200 including a storage device 202 having a solid-state storage media and including error correction coding. The storage device 202 is a hybrid storage device that includes both disc storage media (one or more discs 256) and solid-state storage media, such as a flash memory device (data flash 234, flash firmware 238, etc.). In a particular embodiment, the term "hybrid storage device" refers to a storage device that includes disc storage media and solid-state data storage media. The hybrid storage device 202 is adapted to communicate with a host system 204. In a particular embodiment, the host system 204 can be a computer, a processor, a personal digital assistant (PDA), another electronic device, or any combination thereof. In a particular example, the hybrid storage device 202 can communicate with the host system 204 via a universal serial bus (USB), another type of communication interface, or any combination thereof. In another particular example, the hybrid storage device 202 can be a stand-alone device that is adapted to communicate with the host system 204 via a network, such as via a network cable using a networking protocol.

The hybrid storage device 202 includes recording subsystem circuitry 206 and a head-disc assembly 208. The recording subsystem circuitry 206 includes storage device read/write control circuitry 210 and disc-head assembly control circuitry 220. The recording subsystem circuitry 206 further includes an interface circuit 212, which includes a data buffer for temporarily buffering data received via the interface circuit 212 and which includes a sequencer for directing the operation of the read/write channel 216 and the preamplifier 250 during data transfer operations. The interface circuit 212 is coupled to the host system 204 and to a control processor 218, which is adapted to control operation of the hybrid storage device 202.

The control processor 218 is coupled to a servo circuit 222 that is adapted to control the position of one or more read/write heads 254 relative to one or more discs 256 as part of a servo loop established by the one or more read/write heads 254. The one or more read/write heads 254 can be mounted to a rotary actuator assembly to which a coil 252 of a voice coil motor (VCM) is attached. The VCM includes a pair of magnetic flux paths between which the coil 252 is disposed so that the passage of current through the coil 252 causes magnetic interaction between the coil 252 and the magnetic flux paths, resulting in the controlled rotation of the actuator assembly and the movement of the one or more heads 254 relative to the surfaces of the one or more discs 256. In a particular embodiment, the one or more discs 256 represent rotatable, non-volatile storage media adapted to store data, compiled applications, other information, or any combination thereof. The servo circuit 222 is used to control the application of current to the coil 252, and hence the position of the heads 254 with respect to the tracks of the one or more discs 256.

The disc-head assembly control circuitry 220 includes the servo circuit 222 and includes a spindle circuit 224 that is coupled to a spindle motor 258 to control the rotation of the one or more discs 256. The hybrid storage device 202 also includes an auxiliary power device 228 that is coupled to voltage regulator circuitry 226 of the disc-head assembly control circuitry 220 and that is adapted to operate as a power source when power to the hybrid storage device 202 is lost. In a particular embodiment, the auxiliary power device 228 can be a capacitor or a battery that is adapted to supply power to the hybrid storage device 202 under certain operating conditions. In a particular example, the auxiliary power device 228 can provide a power supply to the recording subsystem assembly 206 and to the disc-head assembly 208 to record data to the one or more discs 256 when power is turned off. Further, the auxiliary power device 228 may supply power to the recording subsystem assembly 206 to record data to the data flash 234 when power is reduced.

Additionally, the hybrid storage device 202 includes the data flash memory 234, a dynamic random access memory (DRAM) 236, firmware 238 (such as a flash memory), other memory 242, or any combination thereof. In a particular embodiment, the firmware 238 is accessible to the control processor 218 and is adapted to store instructions that can be executed by the control processor 218.

In a particular embodiment, the data flash 234 is adapted to store data and associated error correction code (ECC) information, as generally indicated at 260, using an ECC encoder/decoder 218 of the read/write channel 216. In a particular embodiment, the control processor 218 is adapted to control programming of the data flash 234 in a single programming cycle, relying on the ECC encoder/decoder 218 to correct any errors included in the data 260. In a particular embodiment, the ECC encoder/decoder 218 is sufficiently powerful to correct three or more errors in the stored data using the associated ECC information 260.

Further, the flash firmware 238 includes write/read-verify retry instructions 242 that are executable by the control processor 218 to control a number of read-verify operations during programming of the data flash 234. In a particular embodiment, the data flash 234 can be programmed with the data and the associated ECC information 260 in a single programming cycle and without performing a read-verify operation. In a particular embodiment, a write/read-verify operation is repeated until the read-verify operation reveals a number of data errors that is within a range that can be corrected by the ECC encoder/decoder 218.

Figure 3:
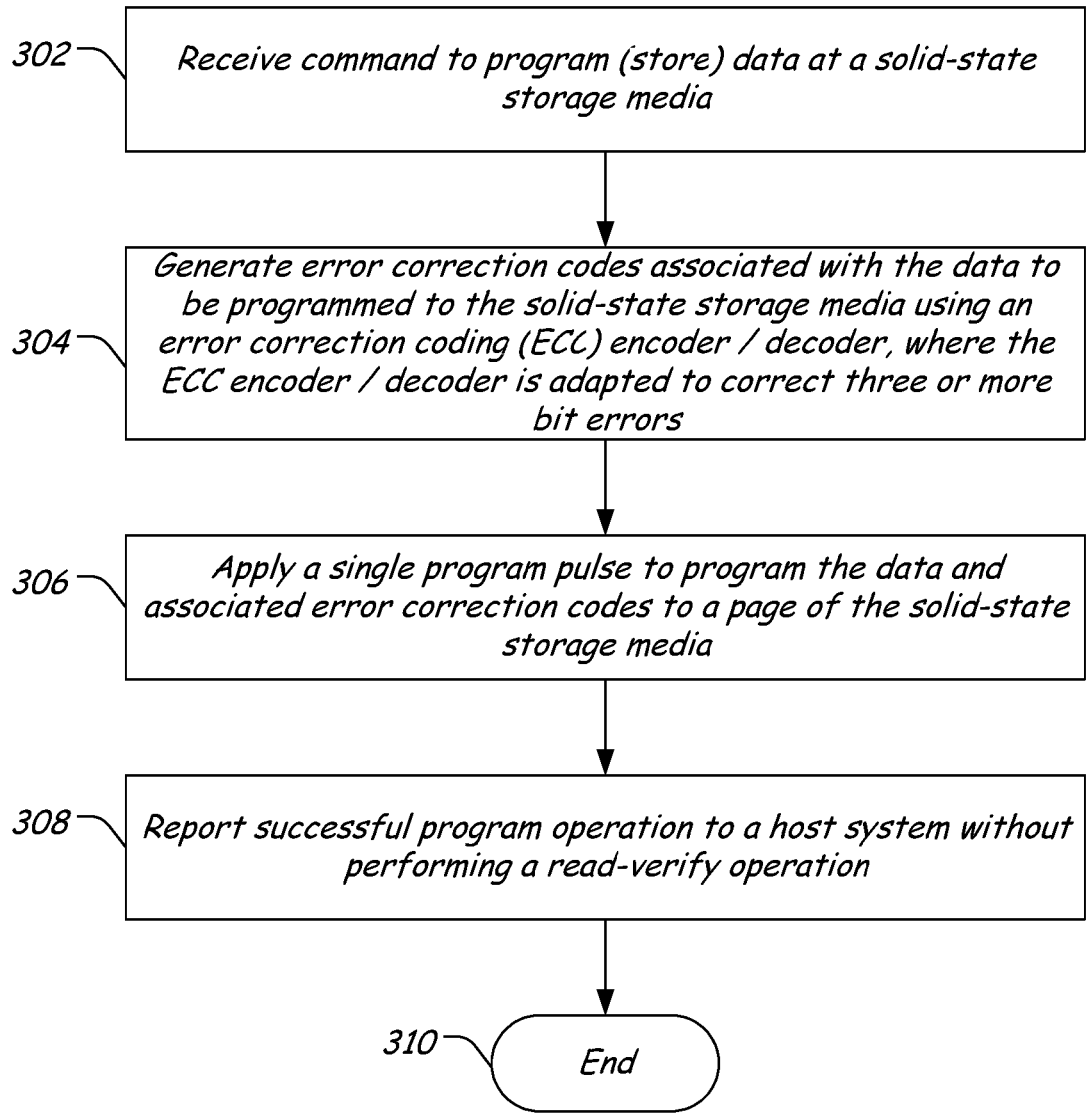
FIG. 3 is a flow diagram of a particular illustrative embodiment of a method of reducing write/read-verify operations using error correction coding.

FIG. 3 is a flow diagram of a particular illustrative embodiment of a method of reducing write/read-verify operations using error correction coding. At 302, a command is received at a storage device to program (store) data at a solid-state storage media of the storage device. In a particular embodiment, the command is received from a host system via a host interface. In another particular embodiment, the command can be initiated by a controller of the storage device. Advancing to 304, error correction code information is generated from the data to be programmed to the solid-state storage media using an error correction coding (ECC) encoder/decoder, where the ECC encoder/decoder is adapted to correct three or more bit errors within the data. In a particular embodiment, the ECC encoder/decoder is configured to utilize powerful ECC coding, such as a parameterized class of ECC codes, which can be configured to define a block length and acceptable error thresholds. In a particular example, the ECC encoder/decoder can use Bose-Chaudhuri-Hocquenghem (BCH) coding to encode and decode data stored at the solid-state data storage media and to correct multiple errors within a page (or block) of data read from the solid-state storage media.

Continuing to 306, a single program pulse is applied to program the data and the associated ECC information to a page of the solid-state storage media. Proceeding to 308, successful program operation is reported to a host system without performing a read-verify operation. In a particular example, since the ECC encoder/decoder uses powerful ECC coding, data errors in the stored data can be corrected and multiple write/read-verify operations can be avoided. The method terminates at 310.

In an alternative embodiment, a controller of the solid-state storage media can perform a read-verify operation after a write operation to determine a number of data errors by comparing the received data to the read data. When the number of data errors exceeds a pre-determined error limit (which may be related to a number of errors that can be corrected using the ECC information), the controller may cause the read/write circuit to re-program the solid-state storage media with the received data. In a particular example, by using a powerful ECC encoder/decoder, a single write/read-verify operation may be sufficient to store the data, since any data errors can be corrected using the ECC information.

Figure 4:
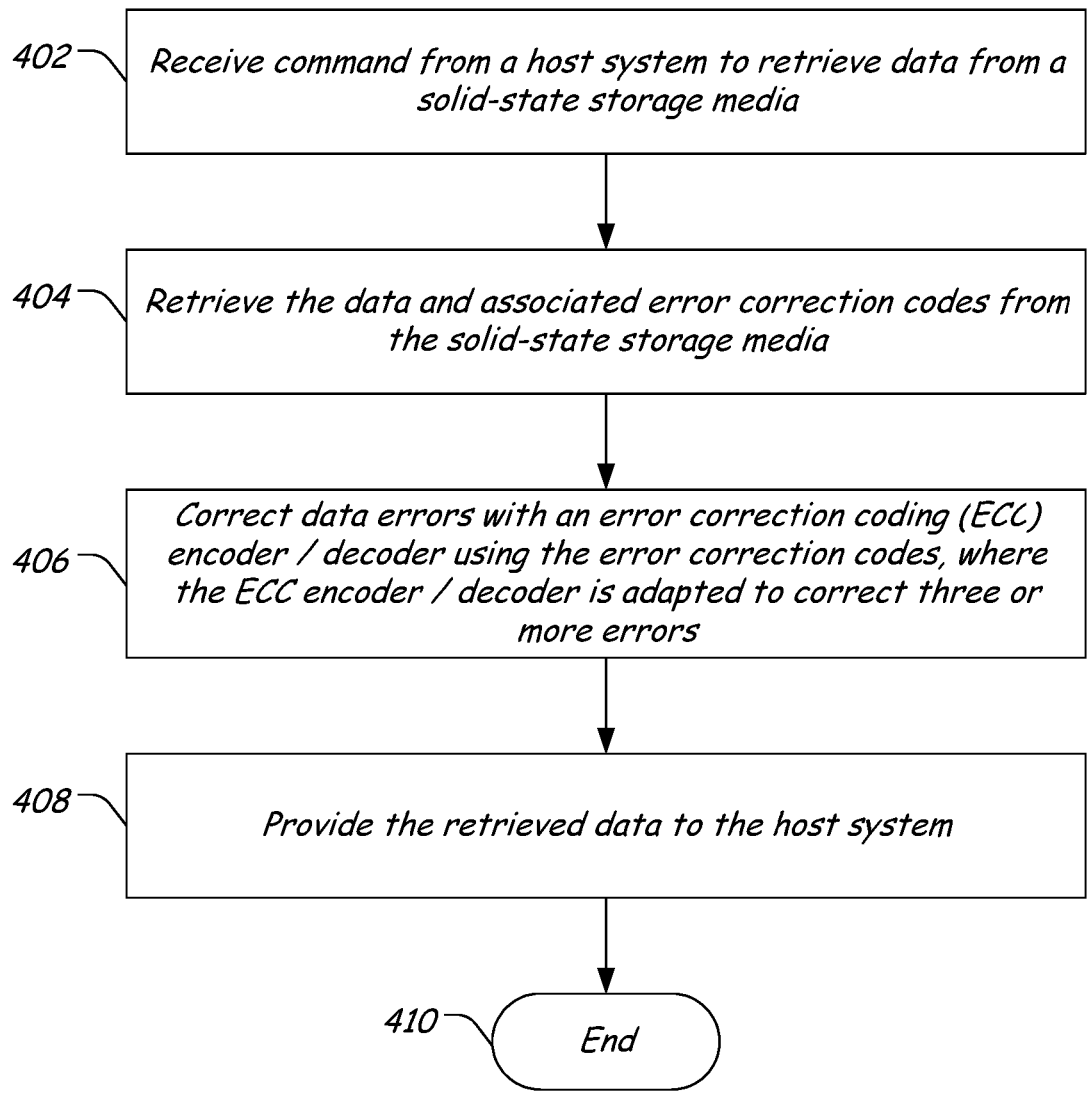
FIG. 4 is a flow diagram of a second particular illustrative embodiment of a method of reducing write/read-verify operations using error correction coding.

FIG. 4 is a flow diagram of a second particular illustrative embodiment of a method of reducing write/read-verify operations using error correction coding. At 402, a command is received from a host system to retrieve data from a solid-state storage media. Advancing to 404, the data and associated error correction code (ECC) information are retrieved from the solid-state storage media. Continuing to 406, data errors are corrected using an error correction coding (ECC) encoder/decoder based on the associated ECC information, where the ECC encoder/decoder is adapted to correct three or more errors. Proceeding to 408, the corrected data is provided to the host system. The method terminates at 410.

In a particular embodiment, the ECC encoder/decoder makes it possible to program data to the solid-state storage media in a single programming cycle. In another particular embodiment, the ECC encoder/decoder makes it possible to program the data to the solid-state storage media without performing a read-verify operation. A particular advantage realized by using a powerful ECC is that, not only can errors be corrected in the data retrieved from the storage media, but the number of write (programming) operations to write data to the storage media can be reduced. By reducing the number of write operations, the longevity and reliability of the storage media can be enhanced.

In conjunction with the storage systems and methods disclosed above with respect to FIGS. 1-4, a storage device is disclosed that includes a solid-state storage media, such as a flash memory, and that includes a read/write circuit that has an error correction coding (ECC) encoder/decoder. The ECC encoder/decoder is adapted to calculate ECC information for data to be written to the storage media, and the read/write circuit is adapted to store the data and the associated ECC information to the storage media. In a particular embodiment, the ECC encoder/decoder is adapted to correct three or more data errors within a page of data. In another particular embodiment, the read/write circuit is adapted to record data to the storage media in a single programming cycle and without performing a read-verify operation.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the data storage system while maintaining substantially the same functionality without departing from the scope and spirit of the present invention.

In addition, although a particular embodiment described herein is directed to a solid-state data storage system for reliably storing data, it will be appreciated by those skilled in the art that the teachings of the present invention can be applied to hybrid data storage systems that include solid-state storage media and disc storage media, without departing from the scope and spirit of the present invention.

What is claimed is:

1. A storage device comprising:
   a nonvolatile solid-state data storage medium; and
   a read/write circuit including an error correction coding (ECC) encoder/decoder adapted to store data and associated ECC information at the nonvolatile solid-state data storage media without performing a read-verify operation.

2. The storage device of claim 1, wherein the read/write circuit is adapted to retrieve the data and the associated ECC information from the nonvolatile solid-state data storage medium and to correct errors in the retrieved data using the ECC encoder/decoder based on the associated ECC information.

3. The storage device of claim 2, wherein the ECC encoder/decoder is adapted to calculate ECC information from the retrieved data and to compare the calculated ECC information to the retrieved ECC information to identify and correct data errors.

4. The storage device of claim 1, wherein the ECC encoder/decoder is adapted to correct three or more errors in the retrieved data based on the associated ECC information.

5. The storage device of claim 1, further comprising:
   an interface responsive to a host system to receive the data and associated storage commands; and
   wherein the ECC encoder/decoder is adapted to calculate ECC information associated with the data before storing the data and the associated ECC information at the nonvolatile solid-state data storage medium.

6. The storage device of claim 1, wherein the nonvolatile solid-state data storage medium comprises Flash memory and the read/write circuit writes the data and the associated ECC information to the nonvolatile solid-state data storage medium during a single programming cycle.

7. The storage device of claim 1, wherein the ECC encoder/decoder is a strong Bose-Chaudhuri-Hocquenghem (BCH) encoder/decoder adapted to encode the data, calculate the associated ECC information, and correct multiple errors within a page of retrieved data.

8. An apparatus comprising:
a data storage device including:
a nonvolatile solid-state data storage medium; and
a write mechanism including an error correction coding (ECC) encoder adapted to provide correction capabilities of at least three data errors within a page of data for the nonvolatile solid-state data storage medium, the write mechanism configured to receive data and calculate associated ECC information related to the data; and
the data storage device is adapted to store the data and the associated ECC information at the nonvolatile solid-state data storage medium without performing a read-verify operation.

9. The apparatus of claim 8, wherein the nonvolatile solid-state data storage medium comprises a Flash memory.

10. The apparatus of claim 8, wherein the data storage device is adapted to store the data and the associated ECC information at the nonvolatile solid-state data storage medium in a single programming cycle.

11. The apparatus of claim 8, wherein the ECC encoder includes a first parameter to define a block length of received data and a second parameter to configure acceptable error thresholds.

12. The apparatus of claim 11, wherein the ECC encoder is a Bose-Chaudhuri-Hocquenghem (BCH) encoder adapted to encode the data, calculate the associated ECC information, and provide a capability to correct multiple errors within a page of retrieved data.

13. The apparatus of claim 8, wherein the associated ECC information comprises a matrix of ECC values that can be used to correct three or more data errors in data retrieved from the nonvolatile solid-state data storage medium.

14. A storage device comprising:
an interface responsive to a host system to receive data and storage commands;
a nonvolatile solid-state data storage medium; and
a write circuit including an error correction coding (ECC) encoder adapted to calculate ECC information associated with the data, the write circuit adapted to store the data to the nonvolatile solid-state data storage medium in a single programming cycle without performing a read-verify operation.

15. The storage device of claim 14, wherein the ECC encoder includes a first parameter to define a block length of received data and a second parameter to configure an acceptable error threshold.

16. The storage device of claim 14, wherein the ECC comprises Bose-Chaudhuri-Hocquenghem (BCH) coding that is configured to correct multiple errors in a page of data for the nonvolatile solid-state data storage medium.

17. The storage device of claim 16, wherein the ECC encoder is adapted to correct three or more data errors in the page of data based on associated ECC information.

18. The storage device of claim 14, further comprising:
a rotatable data storage medium; and
a controller adapted to store received data to the nonvolatile solid-state data storage medium or the rotatable data storage medium;
wherein the ECC encoder also calculates ECC information for the received data that is to be stored at the rotatable data storage medium.

19. The storage device of claim 14, wherein the data and the ECC information are stored at the nonvolatile solid-state storage medium without performing a read verify operation.

20. The storage device of claim 14, wherein the ECC information comprises a matrix of ECC values that can be used to correct data errors when data is retrieved from the nonvolatile solid-state storage medium.

* * * * *